(12) United States Patent
Horie

(10) Patent No.: US 9,160,254 B2
(45) Date of Patent: *Oct. 13, 2015

(54) PIEZOELECTRIC DEVICE AND ELECTRONIC APPARATUS

(71) Applicant: Seiko Epson Corporation, Tokyo (JP)

(72) Inventor: Kyo Horie, Okaya (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/153,388

(22) Filed: Jan. 13, 2014

(65) Prior Publication Data

US 2014/0125420 A1      May 8, 2014

Related U.S. Application Data

(60) Division of application No. 13/906,683, filed on May 31, 2013, which is a continuation of application No. 13/217,685, filed on Aug. 25, 2011, now Pat. No. 8,754,718.

(30) Foreign Application Priority Data

Mar. 11, 2011   (JP) .................................. 2011-054014

(51) Int. Cl.
| | |
|---|---|
| *H03L 1/04* | (2006.01) |
| *H03B 5/32* | (2006.01) |
| *H03B 1/02* | (2006.01) |
| *H02N 2/00* | (2006.01) |
| *H03L 1/02* | (2006.01) |

(52) U.S. Cl.
CPC ................. *H02N 2/001* (2013.01); *H03B 1/02* (2013.01); *H03B 5/32* (2013.01); *H03L 1/022* (2013.01); *H03L 1/028* (2013.01); *H03L 1/04* (2013.01)

(58) Field of Classification Search
CPC .............. H03B 5/32; H03B 5/36; H03L 1/02; H03L 1/022; H03L 1/028
USPC ............ 331/116 R, 116 FE, 158, 176, 68, 66; 310/315, 341, 344, 346
See application file for complete search history.

(56) References Cited

U.S. PATENT DOCUMENTS

| | | |
|---|---|---|
| 4,949,055 A | 8/1990 | Leitl |
| 5,500,628 A | 3/1996 | Knecht |
| 6,229,249 B1 | 5/2001 | Hatanaka et al. |
| 6,229,404 B1 | 5/2001 | Hatanaka |

(Continued)

FOREIGN PATENT DOCUMENTS

| | | |
|---|---|---|
| JP | 11-145768 | 5/1999 |
| JP | 2000-151283 A | 5/2000 |

(Continued)

*Primary Examiner* — Ryan Johnson
(74) *Attorney, Agent, or Firm* — Harness, Dickey & Pierce, P.L.C.

(57) ABSTRACT

A piezoelectric device includes an insulating substrate, a piezoelectric vibration device that is mounted on a device mounting pad, a metal lid member that seals the piezoelectric vibration device in an airtight manner, an external pad that is arranged outside the insulating substrate, an oscillation circuit, a temperature compensation circuit, and a temperature sensor. The lid member and the temperature sensor or the lid member and the IC component are connected to each other so as to be heat-transferable, and a heat transfer member having thermal conductivity higher than that of the material of the insulating substrate is additionally included.

20 Claims, 4 Drawing Sheets

(56) References Cited

U.S. PATENT DOCUMENTS

| | | |
|---|---|---|
| 6,946,922 B2 | 9/2005 | Takemura et al. |
| 7,259,501 B2 | 8/2007 | Usuda |
| 7,317,246 B2 | 1/2008 | Sato |
| 7,382,204 B2 | 6/2008 | Arai et al. |
| 7,468,574 B2 | 12/2008 | Horie et al. |
| 7,471,162 B2 | 12/2008 | Ishikawa et al. |
| 7,474,039 B2 | 1/2009 | Horie |
| 7,710,002 B2 | 5/2010 | Horie et al. |
| 7,759,844 B2 | 7/2010 | Miyahara et al. |
| 8,212,626 B2 | 7/2012 | Arai |
| 8,754,718 B2 * | 6/2014 | Horie .......................... 331/158 |
| 2007/0126316 A1 | 6/2007 | Usuda et al. |
| 2009/0212878 A1 | 8/2009 | Arai et al. |
| 2009/0276990 A1 | 11/2009 | Horie et al. |
| 2010/0123522 A1 | 5/2010 | Kasahara |
| 2011/0187422 A1 | 8/2011 | Hammes et al. |
| 2011/0234047 A1 | 9/2011 | Muraki et al. |

FOREIGN PATENT DOCUMENTS

| | | | |
|---|---|---|---|
| JP | 2001-077627 A | 3/2001 |
| JP | 2002-271142 A | 9/2002 |
| JP | 2004-007469 A | 1/2004 |
| JP | 2005-175848 A | 6/2005 |
| JP | 2005-286892 A | 10/2005 |
| JP | 2005-348120 A | 12/2005 |
| JP | 2005-348121 A | 12/2005 |
| JP | 2006-191517 A | 7/2006 |
| JP | 2006-287594 A | 10/2006 |
| JP | 2006-339943 A | 12/2006 |
| JP | 2007-013020 A | 1/2007 |
| JP | 2007-065959 A | 3/2007 |
| JP | 2007-096881 A | 4/2007 |
| JP | 2007-158521 A | 6/2007 |
| JP | 2007-158522 A | 6/2007 |
| JP | 2007-158541 A | 6/2007 |
| JP | 2007-336346 A | 12/2007 |
| JP | 2008-205938 A | 9/2008 |
| JP | 2008-263564 A | 10/2008 |
| JP | 2008-278543 A | 11/2008 |
| JP | 2008-301515 A | 12/2008 |
| JP | 2009-005117 A | 1/2009 |
| JP | 2009-147976 A | 7/2009 |
| JP | 2009-171607 A | 7/2009 |
| JP | 2009-175155 A | 8/2009 |
| JP | 2010-035078 A | 2/2010 |
| JP | 2010-119031 A | 5/2010 |
| JP | 2010-135995 A | 6/2010 |
| JP | 2011-211340 A | 10/2011 |
| JP | 2012-080249 A | 4/2012 |
| JP | 2012-080250 A | 4/2012 |
| JP | 2012-099928 A | 5/2012 |
| JP | 2012-099935 A | 5/2012 |
| JP | 2012-099944 A | 5/2012 |
| JP | 2012-119911 A | 6/2012 |
| JP | 2012-142683 A | 7/2012 |
| JP | 2012-142688 A | 7/2012 |
| JP | 2012-142691 A | 7/2012 |
| JP | 2012-160870 A | 8/2012 |
| JP | 2012-160875 A | 8/2012 |
| JP | 2012-182565 A | 9/2012 |
| JP | 2012-182567 A | 9/2012 |
| JP | 2012-249265 A | 12/2012 |

* cited by examiner

PIEZOELECTRIC DEVICE AND ELECTRONIC APPARATUS

CROSS-REFERENCE TO RELATED APPLICATION

This is a divisional application of U.S. application Ser. No. 13/906,683 filed May 31, 2013, which is a continuation application of U.S. application Ser. No. 13/217,685 filed Aug. 25, 2011, which claims priority to Japanese Patent Application No. 2011-054014, filed Mar. 11, 2011 all of which are expressly incorporated by reference herein in their entireties.

BACKGROUND

1. Technical Field

The present invention relates to a piezoelectric device, which is, for example, acquired by mounting a temperature-sensor attached electronic component outside a package of a piezoelectric vibrator, capable of realizing high-accuracy temperature characteristics including frequency drift characteristics at the time of start-up by allowing the thermal status of the electronic component to approach that of the piezoelectric vibration device and an electronic apparatus having the piezoelectric device built therein.

2. Related Art

In the mobile communication market, the number of manufactures increases which modularize a component group for each function in consideration of mounting various electronic components, the maintenance and handling thereof, and common characteristics of components between devices. In addition, a decrease in size and cost reduction are strongly demanded in accordance with the modularization.

Particularly, the tendency of modularization becomes strong for circuit components, of which the functions and the hardware configurations are set up and which requires high stability and high capability, such as an oscillation circuit used for generating a reference frequency signal, a PLL circuit, and a synthesizer circuit. Furthermore, by packaging such a component group as a module, there is an advantage that the shield structure can be easily set up.

As examples of a surface mounting-type IC component that is built by modularizing and packaging a plurality of related components, there are a piezoelectric vibrator, a piezoelectric oscillator, a SAW device, and the like.

In JP-A-2006-191517, JP-A-2008-263564, and JP-A-2010-035078, surface mounting-type piezoelectric oscillators are disclosed which have a structure in which an IC component including an oscillation circuit and a temperature compensation circuit is assembled outside a package of a piezoelectric vibrator for achieving further miniaturization while such functions are maintained well.

In such a type of piezoelectric oscillator, a difference between the temperature of a piezoelectric vibration device disposed inside the piezoelectric vibrator and the temperature detected by the temperature sensor mounted in the IC component that is connected to the outside of the piezoelectric vibrator may easily occur. Thus, in a case where there is a temperature difference, the oscillation frequency of the oscillator is corrected based on an output of the temperature sensor that is based on incorrect temperature data. Accordingly, it is difficult to acquire stable temperature-frequency characteristics, and the frequency drift characteristics at the time of start-up deteriorate.

In order to respond to such an inconvenience, generally, a configuration has been considered in which the temperature of the insulating substrate side, to which a piezoelectric vibrating reed is directly connected, is used as a measurement point.

In JP-A-2006-191517, a technology is disclosed in which the temperature-frequency characteristics and the frequency drift characteristics are stabilized in a temperature-compensation type piezoelectric oscillator in which an IC component as an oscillation circuit device is connected to an electrode portion arranged outside a piezoelectric vibrator in which the piezoelectric vibrating reed is housed inside the package by arranging a temperature sensor near the connection terminal of the IC component connected to the electrode portion so as to decrease the difference between the temperature of the piezoelectric vibrating reed and the temperature detected by the temperature sensor.

However, the connection terminal of the IC component that is connected to the electrode portion of the piezoelectric vibrator side is configured so as to be conductive to an amplifier of the oscillation circuit. In the amplifier, since heat is generated in accordance with the operation thereof, when the temperature sensor approaches the electrode portion of the piezoelectric vibrator side within the IC component, the temperature of the heated IC component may be detected in some cases, and the above-described frequency drift characteristics may deteriorate.

Next, in JP-A-2008-263564, a technology is disclosed in which the temperature-frequency characteristics and the frequency drift characteristics are stabilized by decreasing a difference between the temperature of a piezoelectric vibration device and the temperature detected by a temperature sensor by housing a first IC component including an oscillation circuit and a temperature sensor inside a piezoelectric vibrator in which a piezoelectric vibration device is housed inside a package, connecting a second IC component including a temperature compensation circuit to the outside of the piezoelectric vibrator and arranging the temperature sensor under the same temperature environment as that of the piezoelectric vibration device.

However, a structure in which the IC component that may be originally assembled outside the piezoelectric vibrator is divided into two components, and the first IC component to which the temperature sensor is attached is housed inside the package has a low possibility of implementation in terms of cost-performance and blocks the miniaturization of the entire oscillator.

Next, in JP-A-2010-035078, a technology is disclosed in which the temperature-frequency characteristics and the frequency drift characteristics are stabilized by decreasing a difference between the temperature of a piezoelectric vibration device and the temperature detected by a temperature sensor by connecting an IC component to a concave portion arranged outside a package housing the piezoelectric vibration device in a cantilever supporting state and connecting the temperature sensor terminal of the IC component to a pillow member arranged inside the package.

However, since a conductive adhesive is interposed between the piezoelectric vibration device and a ceramic base of the package, the speed of heat transfer to the piezoelectric vibration device is slower than the speed of heat transfer to the temperature sensor terminal through the pillow member. Accordingly, it is difficult to effectively improve the frequency drift characteristics.

In any structure disclosed in the above-described technologies, the piezoelectric vibration device is configured so as to be mounted in the ceramic substrate (insulating substrate), and accordingly, it is understood that the temperature of the piezoelectric vibration device can be accurately detected by measuring the temperature of the ceramic substrate that is directly connected to the piezoelectric vibration device to which a physical distance is short. However, actually, the effect of further improving the frequency drift characteristics could not be sufficiently acquired.

As above, in a general surface mounting-type piezoelectric oscillator in which the IC component including a temperature sensor is connected to the outside of the piezoelectric vibrator, there are problems in that a difference between the temperature of the piezoelectric vibration device located inside the piezoelectric vibrator and the temperature detected by the temperature sensor arranged outside the piezoelectric vibrator may easily occur, stable temperature-frequency characteristics cannot be acquired, and the frequency drift characteristics at the time of start-up deteriorate.

SUMMARY

An advantage of some aspects of the invention is that it provides a surface mounting-type piezoelectric oscillator, which is acquired by building an IC component including a temperature sensor outside a package of a piezoelectric vibrator, capable of realizing high-accuracy temperature characteristics including frequency drift characteristics at the time of start-up by thermally connecting a metal lid member, which is in a thermal status equivalent to that of the piezoelectric vibration device due to its proximity to the piezoelectric vibration device, and the IC component.

Application Example 1

This application example of the invention is directed to a piezoelectric device including: an insulating substrate that includes a piezoelectric vibration device and a mounting terminal used for surface mounting; a metal lid member that is used for sealing the piezoelectric vibration device between the insulating substrate and the lid member in an airtight manner, and an electronic component that includes at least a temperature sensor used for detecting temperature. The insulating substrate includes an external pad that is an electrode and a heat transfer member that has thermal conductivity higher than that of an insulating material of the insulating substrate and connects the external pad and the lid member, the electronic component is mounted in the external pad, and the lid member and the temperature sensor are connected so as to be heat-transferable through the external pad and the heat transfer member.

According to this application example, the lid member that is located at a position closest to the piezoelectric vibration device housed in an airtight space of the package and the temperature sensor or the electronic component in which the temperature sensor is mounted are thermally connected to each other through the heat transfer member having high thermal conductivity. Accordingly, incorrect temperature data is not output from the temperature sensor, whereby the frequency drift characteristics can be improved.

Application Example 2

This application example of the invention is directed to the above-described piezoelectric device, wherein the heat transfer member is made of metal and is electrically insulated from the mounting terminal.

According to this application example, since the heat transfer member is formed from an arbitrary metal material having thermal conductivity higher than that of the material of the insulating substrate and is electrically insulated from the mounting terminal, the temperature sensor and the lid member or the like can be connected to each other so as to have high thermal conductivity.

Application Example 3

This application example of the invention is directed to the above-described piezoelectric device, wherein the electronic component is a chip-shaped IC component in which the temperature sensor, a temperature compensation circuit, and an oscillation circuit used for amplifying an excitation signal of the piezoelectric vibration device for oscillation are formed as an integrated circuit.

Although, as examples of the electronic component, various components can be considered, as an example, there is the IC component.

Application Example 4

This application example of the invention is directed to the above-described piezoelectric device, wherein the electronic component is a thermistor.

Application Example 5

This application example of the invention is directed to the above-described piezoelectric device, wherein the external pad connected to the heat transfer member is connected to at least one of an adjustment terminal, a dummy terminal, and a temperature sensor terminal of the electronic component.

Such a neutral terminal can transfer the heat of the lid member to the temperature sensor mounted in the IC component without being influenced by the heat of a main board.

Application Example 6

This application example of the invention is directed to the above-described piezoelectric device, wherein the insulating substrate is configured so as to include an upper concave portion used for housing the piezoelectric vibration device on an upper face and includes a lower concave portion used for housing the electronic component on a lower face, the external pad is included in the lower concave portion, and the heat transfer member is thermally connected to the electronic component through the external pad that is arranged in the lower concave portion.

The insulating substrate, for example, may have a longitudinal cross-section shape of "H".

Application Example 7

This application example of the invention is directed to the above-described piezoelectric device, wherein the insulating substrate includes: a package unit that houses the piezoelectric vibration device on the inside thereof and includes a device housing concave portion of which an upper opening is sealed by the lid member; and an electronic component mounting unit that is drawn out from the package unit to the outer side and includes the external pad on the upper face, and the heat transfer member is thermally connected to the electronic component through the external pad.

The invention can also be applied to an insulating substrate that includes the package unit and the IC component mounting unit that is drawn out from the package unit to the outside.

Application Example 8

This application example of the invention is directed to the above-described piezoelectric device, wherein the external pad and the mounting terminal are configured so as to be conductive to each other.

Application Example 9

This application example of the invention is directed an electronic apparatus including any one of the piezoelectric devices according to Application Examples 1 to 6.

The piezoelectric devices according to the application examples of the invention can be applied to various electronic apparatuses.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
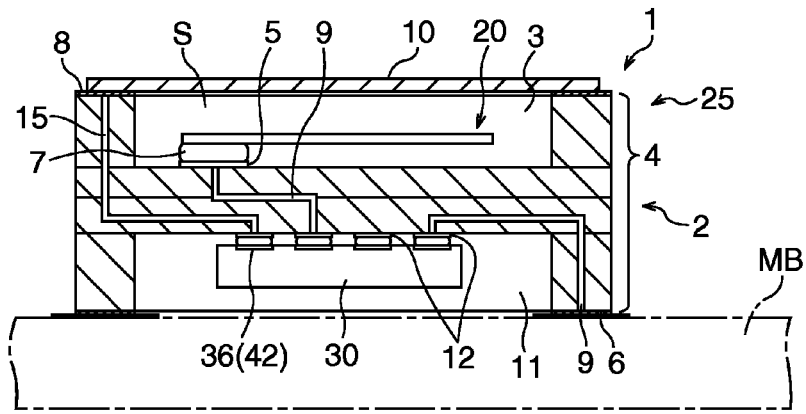
FIG. 1 is a longitudinal cross-sectional view of a crystal oscillator as an example of a surface mounting-type piezoelectric oscillator according to an embodiment of the invention.

First, the inventors of the invention found that the temperature of a piezoelectric vibration device is closer to the temperature of a lid member than that of an insulation container in which the piezoelectric vibration device is directly mounted.

Thus, in embodiments of the invention, the temperature of the lid member, to be described later, is configured to be detected by using a temperature sensor to be described later for detecting the temperature of the piezoelectric vibration device.

Hereinafter, embodiments of the invention that are illustrated in the drawings will be described in detail.

Figure 2:
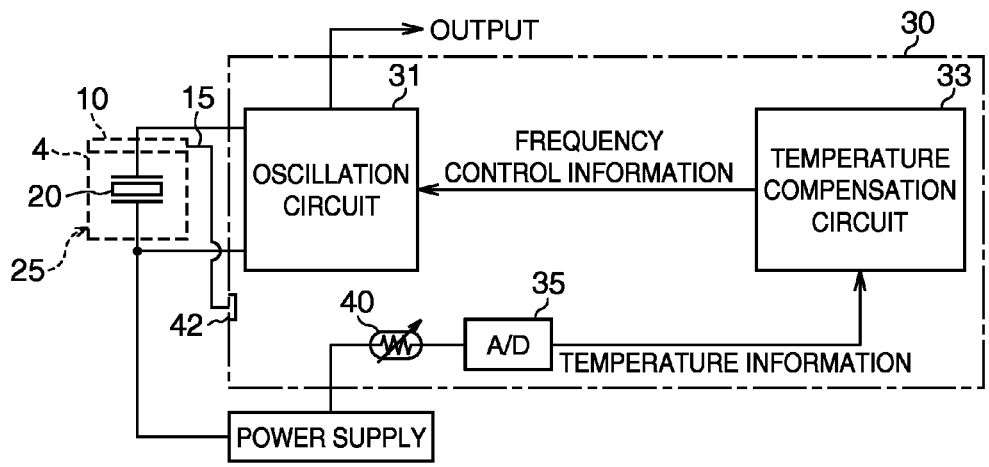
FIG. 2 is a diagram showing the circuit configuration of the crystal oscillator shown in FIG. 1.

FIG. 1 is a longitudinal cross-sectional view of a crystal oscillator as an example of a surface mounting-type piezoelectric oscillator as a piezoelectric device according to an embodiment of the invention. FIG. 2 is a diagram showing the circuit configuration of the crystal oscillator.

The basic configuration of the crystal oscillator (piezoelectric oscillator) 1 according to the embodiment of the invention includes: an insulating container (insulating substrate) 4 that has an internal pad (a device mounting pad) electrically connected to each excitation electrode of the crystal vibration device (piezoelectric vibration device) 20 on the upper side and a plurality of mounting terminals 6 on the lower side; the piezoelectric vibration device 20 that is mounted on the internal pad 5 through a conductive adhesive 7; a metal lid member 10 that seals the piezoelectric vibration device 20 in an airtight manner together with the insulating container 4; an IC component 30 that is mounted on an external pad (an IC component mounting pad) 12 arranged in a portion of the insulating container located outside an airtight space S in which the piezoelectric vibration device is housed and is an electronic component that configures an oscillation circuit, a temperature compensation circuit, and a temperature sensor; a connection conductor 9 that allows conduction between each mounting terminal 6, each internal pad 5, and each external pad 12; and a heat transfer member 15 that connects the lid member and the IC component so as to be thermally conductive and has thermal conductivity higher than that of the material of the insulating substrate.

In addition, it may be configured such that only a temperature sensor such as thermistor instead of the IC component 30 is mounted as an electronic component so as to be connected to the external pad 12.

Next, the detailed configuration of the crystal oscillator (piezoelectric oscillator) 1 shown in FIG. 1 will be described.

The crystal oscillator 1 has a configuration in which the crystal vibration device (piezoelectric vibration device) 20 is mounted inside an upper concave portion 3 arranged on the upper face of a package 2 so as to be sealed in an airtight manner by the metal lid member 10, and the IC component 30 is mounted on an outer bottom face (a lower concave portion 11) of the package 2.

The package 2 includes: the insulating container (the insulating substrate) 4 that is formed from an insulating material such as a ceramic having the upper concave portion 3 on the upper face; two internal pads (component mounting pads) 5 that are arranged inside the upper concave portion 3 and are electrically connected to the respective excitation electrodes of the crystal vibration device 20; a plurality of mounting terminals 6 that are arranged on the outer bottom face of the insulating container 4; the external pad (the IC component mounting pad) 12 arranged inside the outer bottom face (the lower concave portion 11) of the insulating container that is used for mounting the IC component 30 that includes the oscillation circuit, the temperature compensation circuit, and the temperature sensor as an integrated circuit; the connection conductor 9 that allows each mounting terminal 6, each internal pad 5, and the external pad 12 to be conductive to one another; the lid member 10 made of metal (for example, Kovar) that seals the upper concave portion 3 in an airtight manner in a state in which two internal pads 5 disposed inside the upper concave portion 3 and two excitation electrodes disposed on the crystal vibration device (piezoelectric vibration device) 20 are electrically connected to each other; and the heat transfer member 15 that connects the lid member and the IC component so as to be heat-transferable and has thermal conductivity higher than the material of the insulating substrate that is formed from a ceramic.

In this example, the insulating container (insulating substrate) 4 has a longitudinal cross-sectional shape of "H" in which the upper concave portion 3 used for housing the piezoelectric vibration device 20 is arranged on the upper face, and the lower concave portion 11 used for housing the IC component is arranged on the lower face.

The crystal vibration device 20 includes: a crystal substrate (for example, an AT-cut crystal substrate) that is formed from a piezoelectric material such as crystal; the excitation electrodes that are formed in vibration areas arranged on both faces including front and rear faces of the crystal substrate; lead electrodes that extend from the excitation electrodes to the end edge of the crystal substrate; and pads that are arranged in end portions of the lead terminals. By connecting the pads to the internal pads 5 using the conductive adhesive 7, the crystal vibration device is mounted on the insulating container.

Each mounting terminal 6 is arranged on the bottom face of the lower concave portion 11 and, commonly, is configured by four mounting terminals including a driving power mounting terminal (Vcc terminal) that is conductive to lead electrodes arranged on the crystal vibration device 20 side, a control voltage applying mounting terminal (Vcon terminal), a signal-out mounting terminal (Out terminal), and a ground mounting terminal (Gnd) terminal that is used for being conductive to a ground circuit.

In addition, the package 2 and the crystal vibration device 20 configure the crystal vibrator (piezoelectric vibrator) 25.

The heat transfer member 15 is formed from molybdenum or an arbitrary metal material having thermal conductivity higher than that of the material of the insulating substrate. One end portion (an end portion connected to the lid member) of the heat transfer member 15 is thermally connected to the lid member 10, and the other end portion (an end portion connected to the IC component) thereof is thermally connected to an appropriate portion on the outer face of the IC component 30 of a silicon bare chip, whereby the heat transferred from the lid member 10 is conductive to the IC component 30 so as to allow the temperature of at least the lid member 10 (the crystal vibration device 20) and an appropriate portion on the outer face of the IC component 30 or the temperature of a range including the periphery thereof to be equal in a speedy manner and be equivalently maintained. The lid member is made of a metal material having thermal conductivity higher than that of the insulating substrate, and is located proximal to the crystal vibration device 20 disposed inside the upper concave portion 3, whereby the lid member and the crystal vibration device 20 are at equivalent temperatures. Accordingly, by thermally combining the lid member 10 and the IC component by using the heat transfer member 15 having high thermal conductivity, the temperature of the IC component can unlimitedly approach the temperature of the crystal vibration device 20.

In a case where the heat transfer member 15 is wired within the thickness of the insulating container 4, when the insulating container is formed by laminating ceramic sheets, a through hole is formed in a portion of the heat transfer member corresponding to a wiring path, and a metal material is filled (metalized) in the through hole. On the other hand, in a case where a part of the heat transfer member is wired on the outer face of the insulating container, the metal material is metalized at the portion.

The IC component 30 is an IC chip as a bare chip that includes integrated circuits such as an oscillation circuit (an amplifier circuit that is used for amplifying an excitation signal of the piezoelectric vibration device for the use of oscillation) and a temperature compensation circuit (a circuit that is used for compensating the frequency-temperature characteristics of the piezoelectric vibration device), and a temperature sensor (temperature-sensitive device) is built therein.

By connecting each terminal that is arranged so as to be exposed to the outer face of the IC component to the IC component mounting pad 12 through a metal bump formed from gold or the like or soldering in the one-to-one correspondence state, the IC component 30 is fixed to the lower concave portion.

Since the IC component 30 as a bare chip made from silicon has overall uniform and good thermal conductivity, the other end portion of the heat transfer member 15 may be brought into contact with (connected to) any portion of the outer face of the IC component. However, it is preferable that the other end portion of the heat transfer member 15 is brought into contact with a portion that is located near the temperature sensor. More specifically, for example, it is preferable that the other end portion is mechanically and thermally connected to a terminal (a neutral terminal), which is not electrically connected to a main board MB in which the crystal oscillator 1 is mounted, of terminals arranged on the outer face of the IC component through a metal connection medium such as a metal bump.

The reason for this is that a terminal that is electrically connected to the main board MB is configured so as to be conductive to the mounting terminal used for surface mounting.

In the surface mounting, the mounting terminal is brought into surface contact with the main board MB, and accordingly, heat can be easily delivered from the main board MB to the piezoelectric device.

Accordingly, by using a neutral terminal, as described above, a structure is formed in which heat from the lid member can be transferred more easily than heat (temperature) from members other than the lid member 10, which is transferred from the main board MB, to the temperature sensor. Accordingly, the temperature sensor detects the temperature under thermal conditions that are equivalent to those of the crystal vibration device, and the temperature compensation circuit is operated based on the temperature data, whereby the frequency can be controlled with high accuracy.

As examples of the neutral terminal in this embodiment, there are an adjustment terminal that is arranged so as to be exposed to the outer face of the IC component, an NC (non-connect) terminal, a dummy terminal, and the like. Preferably, the neutral terminal is a terminal that is not electrically conductive to the mounting terminal of the main board MB.

By connecting at least one of such terminals and the other end portion of the heat transfer member to each other, it is possible to resolve a temperature difference between the crystal vibration device and the IC component.

The adjustment terminal is disposed for measuring and adjusting the characteristics of the IC component at the time of manufacturing, is not used after the end of the adjustment and the completion of the oscillator, and is not connected to the main board MB. Accordingly, the adjustment terminal can be used for a connection with the lid member.

While the adjustment terminal is conductive to a probe for inputting data to the IC component or outputting data from the IC component, the NC terminal or the dummy terminal does not perform such input or output of data.

Thus, when a temperature change due to a contact with the probe in such an adjustment process is concerned about, it is preferable that the heat transfer member is connected to the NC terminal or the dummy terminal.

As shown in the circuit diagram shown in FIG. 2, in the IC component 30 that is externally attached to the crystal vibrator 25 that includes the crystal vibration device 20, an oscillation circuit 31, a temperature compensation circuit 33, a temperature sensor (thermistor) 40, an A/D converter 35, and the like are mounted. The output (temperature information) of the temperature sensor 40 is formed as a digital signal by the A/D converter 35, and the digital signal is input to the temperature compensation circuit 33. The temperature compensation circuit 33 outputs frequency control information generated based on the temperature information to the oscillation circuit 31. The oscillation circuit 31 outputs temperature compensation frequency information based on the temperature control information.

A terminal 42 shown in FIG. 2 is a neutral terminal that has the functions of an adjustment terminal, an NC (non-connect) terminal, and a dummy terminal.

Although an NC terminal that is not shown in the figure is a terminal that is originally used for inputting a DC voltage for frequency adjustment, it is used for a connection with the lid member in a case where the function thereof as the piezoelectric device is not necessary.

The dummy terminal is a terminal dedicated for heat transfer that does not have a special use other than a thermal connection between the lid member 10 and the IC component through a connection with the heat transfer member.

The heat transfer member 15, as shown in the figure, may be disposed within the thickness of the insulating substrate that is interposed between the lid member and the IC component, or the heat transfer member 15 may be disposed in a state in which a part of the heat transfer member is exposed to an outer portion (including a concave portion inner wall) of the insulating substrate.

As shown in FIG. 1, on an upper end face of the insulating container 4, a metal sealing body such as a seam ring 8 is formed as a sealing member made of metal used for welding the lid member 10. When the insulating container is manufactured, one end portion of the heat transfer member 15 is in a state of being in contact (welded) with the seam ring 8. When the lid member is welded together with the seam ring, one end portion of the heat transfer member is connected to the lid member so as to be fixed. A middle portion of the heat transfer member 15 is disposed within the thickness of the insulating container or along the outer face, and the other end portion thereof extends to the inner bottom face of the lower concave portion 11 and is connected to the external pad 12 that is fixed to the terminal 36 of the IC component that is thermally neutral.

In such a configuration, the lid member and the terminal 36 are connected to each other through metal, and accordingly, a structure having high thermal conductivity is formed.

In order to improve the frequency drift characteristics by allowing the temperature data acquired by the temperature sensor 40 mounted in the IC component 30 to approach the temperature of the crystal vibration device 20 when the crystal oscillator 1 is started up, it is effective to increase the amount of heat to be transferred to the IC component by the heat transfer member 15 as much as possible. Accordingly, although it is effective to increase the diameter of the heat transfer member, there is a limitation on the increase in the diameter in relation with the plate thickness of the insulating substrate, and accordingly, it is practically effective to increase the number of the heat transfer members. In a case where the number of the heat transfer members is increased, the heat transfer members are arranged in the facial direction of the insulating substrate (a direction perpendicular to the thickness direction of the plate).

In a case where a plurality of the heat transfer members is disposed, it may be configured such that, to an appropriate portion of a heat transfer member as a base, the other end portions of the other heat transfer members are connected, and the end portions connected to the IC component are integrally formed. Alternatively, it may be configured such that the connection terminal portion of each heat transfer member is individually connected to the IC component.

Figure 3:
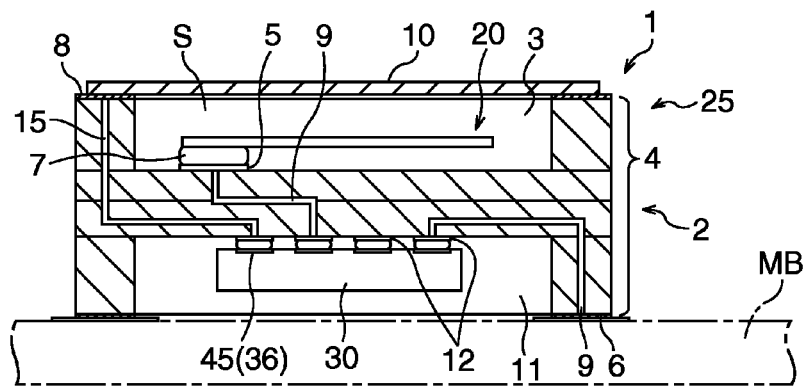
FIG. 3 is a cross-sectional view of a crystal oscillator according to another embodiment of the invention.
Figure 4:
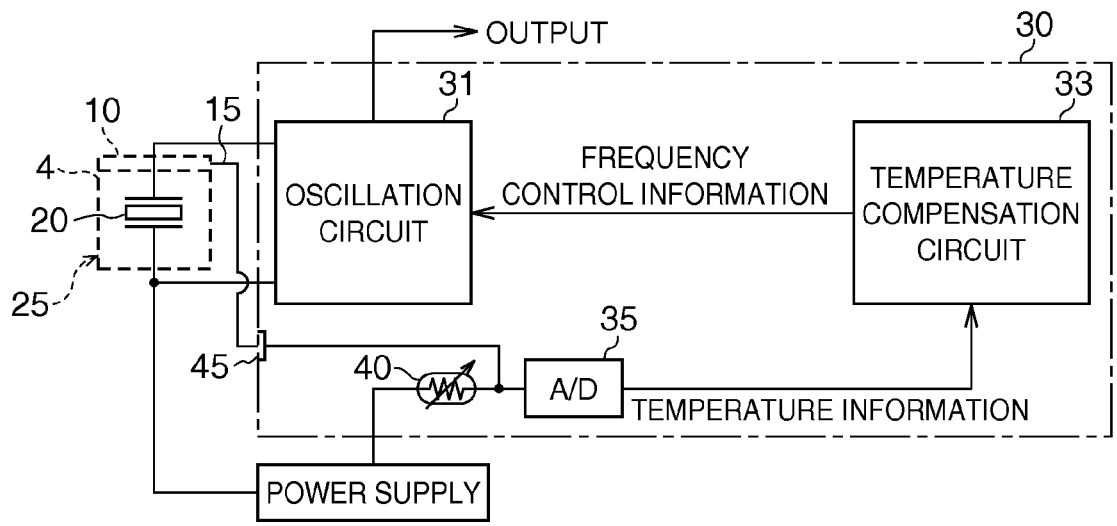
FIG. 4 is a diagram showing the circuit configuration of the crystal oscillator shown in FIG. 3.

FIG. 3 is a cross-sectional view of a crystal oscillator according to another embodiment of the invention, and the same reference numeral is assigned to the same member as that shown in FIG. 1 for the description. FIG. 4 is a diagram showing the circuit configuration of this crystal oscillator.

A difference between the crystal oscillator 1 according to this embodiment and the crystal oscillator 1 according to the embodiment shown in FIG. 1 is that the neutral terminal to which the other end portion of the heat transfer member 15 is connected is configured as a temperature sensor terminal 45 that is arranged so as to be exposed to the outer face of the IC component 30 in this embodiment.

As shown in FIG. 4, the temperature sensor terminal is a terminal that is electrically connected to the temperature sensor (thermistor) 40 and is, for example, a terminal of the temperature sensor that is used for outputting the temperature information. By exposing the temperature sensor terminal 45 to the outer face of the IC component, the temperature sensor terminal 45 is thermally connected to the other end portion of the heat transfer member 15. The temperature sensor terminal 45 is preferably a terminal that is not conductively connected to the main board MB and is further connected to the temperature sensor 40 through a metal wiring arranged on the silicon substrate. Accordingly, by connecting the temperature sensor terminal 45 to the lid member 10, heat from the lid member can be easily transferred to the temperature sensor 40, whereby the sensitivity of the temperature sensor for detecting the temperature of the piezoelectric vibration device can be improved.

Differently from the embodiments described with reference to FIGS. 1 and 2, a neutral terminal that is not thermally and electrically connected to the main board MB in which the crystal oscillator 1 is mounted, that is, preferably a terminal that is not electrically conductive to the mounting terminal of the main board MB may be connected to the lid member 10 through the heat transfer member.

Alternatively, it may be configured such that the area of the other end portion of the heat transfer member 15 is broadened so as to be brought into contact with the outer face (a face other than the terminal forming portion) of the IC component in a broad area, whereby the amount of heat transferred from the lid member to the IC component is increased.

Figure 5:
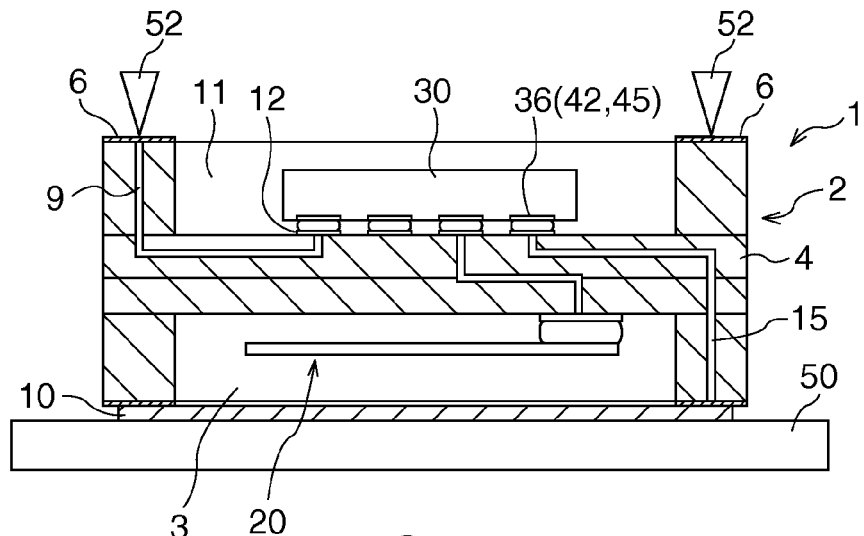
FIG. 5 is a cross-sectional view showing a device configuration in a case where the temperature of the crystal oscillator according to an embodiment of the invention is adjusted.

FIG. 5 is a cross-sectional view showing a device configuration in a case where the temperature of the crystal oscillator according to an embodiment of the invention is adjusted.

When the temperature adjustment is performed, the crystal oscillator 1 is placed in a state in which the outer face of the lid member 10 is brought into facial contact with a flat face of a stage 50 that is heated by a heating unit such as a Peltier device, and the temperature is adjusted while operating the oscillator in a state in which a probe 52 is brought into contact with an external terminal that is arranged on the bottom face of the insulating container 4.

In a case where a temperature adjustment operation is performed for a general crystal oscillator in which the heat transfer member 15 is not included by a temperature adjusting device, the heat of the insulating container is absorbed by the probe 52 that is in contact with the external terminal, and accordingly, there is a deviation between the temperature of the IC component 30 and the temperature of the crystal vibration device 20. In other words, in a general crystal oscillator, the IC component 30 is mounted on the bottom face of the lower concave portion 11, and accordingly, the temperature sensor located inside the IC component detects the temperature of the bottom face of the lower concave portion. Accordingly, as the temperature of the bottom face of the lower concave portion is absorbed by the probe, there is a considerable temperature difference between the crystal vibration device 20 housed in the upper concave portion 3 and the IC component, whereby it is difficult to accurately perform temperature adjustment.

In contrast to this, in a case where temperature adjustment is performed for the crystal oscillator according to each embodiment of the invention, not the temperature of the bottom face of the lower concave portion but the temperature of the lid member 10 brought into contact with the stage 50 is detected by the temperature sensor mounted in the IC component. Accordingly, the temperature difference between the crystal vibration device 20 and the IC component 30 decreases, whereby the accuracy of the temperature adjustment can be improved.

Particularly, in the crystal oscillator according to the embodiment shown in FIG. 3, the temperature sensor terminal 45 is directly connected to the lid member 10. Accordingly, the temperature of the lid member can be measured more directly, whereby the temperature difference of both parties further decreases. Therefore, the adjustment can be performed with higher accuracy.

As above, according to the embodiment of the invention, the temperature detected by the temperature sensor reliably reflects the temperature of the crystal vibration device, whereby the crystal vibration device and the IC component (at least the temperature sensor) are operated based on the same temperature.

Figure 6:
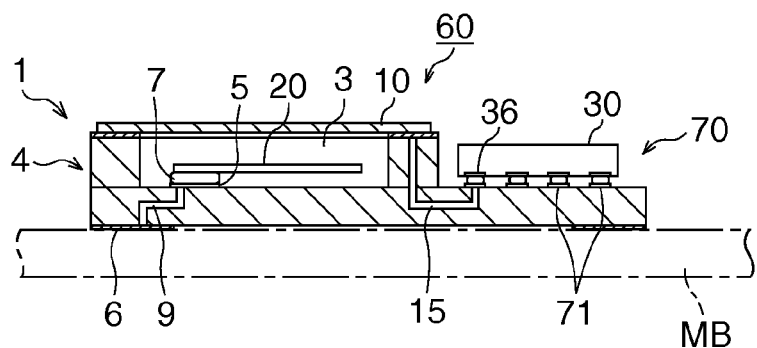
FIG. 6 is a longitudinal cross-sectional view showing the configuration of a crystal oscillator according to another embodiment of the invention.

FIG. 6 is a longitudinal cross-sectional view showing the configuration of a crystal oscillator (piezoelectric oscillator) according to another embodiment of the invention. The same reference numeral is assigned to the same portion as that shown in FIG. 1 for the description.

An insulating container (insulating substrate) 4 that configures this crystal oscillator 1 includes a package unit that houses a crystal vibration device (piezoelectric vibration device) 20 on the inside thereof and includes a device housing concave portion 3 of which an upper opening is sealed by a lid member 10 and an IC component mounting unit 70 that is drawn out from the package unit to the outer side (the lateral side in this example) and includes an IC component mounting pad (external pad) 71 on the upper face thereof.

The crystal oscillator 1 has a configuration in which a crystal vibrator 60 is configured so as to be sealed by the lid member 10 in a state in which the crystal vibration device 20 is housed in the device housing concave portion 3, and an IC component 30 that includes an oscillation circuit, a temperature compensation circuit, and a temperature sensor are connected to the IC component mounting pad 71 through a metal bump or soldering.

A featured configuration of this embodiment is that, by thermally connecting the IC component 30 and the lid member 10 through a heat transfer member 15 arranged on the inside or the outer face of the insulating container (package unit) 4, the temperature of the IC component is uniformized with the temperature of the crystal vibration device 20 that is located near the lid member.

More specifically, similarly to the above-described embodiment, by metalizing the heat transfer member 15, a structure is formed in which a terminal 36 of the IC component 30 and the lid member 10 are connected to each other through a heat transfer path made of metal.

One end portion of the heat transfer member 15 is connected to the lid member 10, and the other end portion thereof may be brought into contact with any portion of the outer face of the IC component of the heat transfer member 15. However, it is preferable that the other end portion of the heat transfer member 15 is brought into contact with a portion of the IC component that is located near the temperature sensor. More specifically, for example, the other end portion is mechanically and thermally connected to a terminal (a neutral terminal) 36, which is not electrically connected to a main board MB in which the crystal oscillator 1 is mounted, of terminals arranged on the outer face of the IC component through a metal connection medium such as a metal bump. Accordingly, a structure is formed in which heat from the lid member can be transferred more easily than heat (temperature) from members other than the lid member 10, which is transferred from the main board MB, to the temperature sensor. Accordingly, the temperature sensor detects the temperature under thermal conditions that are equivalent to those of the crystal vibration device, and the temperature compensation circuit is operated based on the temperature data, whereby the frequency can be controlled with high accuracy.

As examples of the neutral terminal 36 that is thermally neutral, there are an adjustment terminal that is arranged so as to be exposed to the outer face of the IC component, a temperature sensor terminal, an NC (non-connect) terminal, a dummy terminal, and the like. By connecting at least one of such terminals and the other end portion of the heat transfer member to each other, it is possible to resolve a temperature difference between the crystal vibration device and the IC component. Accordingly, the frequency drift characteristics can be improved.

Figure 7:
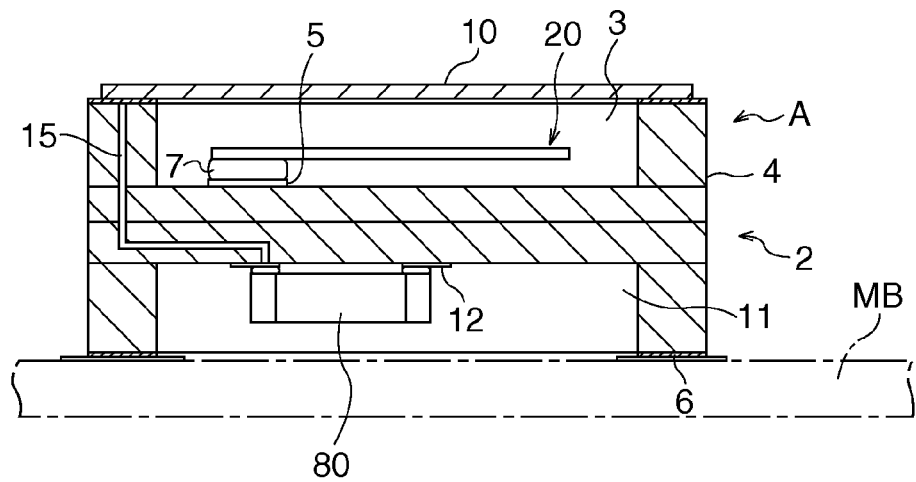
FIG. 7 is a longitudinal cross-sectional view showing the configuration of a crystal oscillator according to further another embodiment of the invention.
Figure 8:
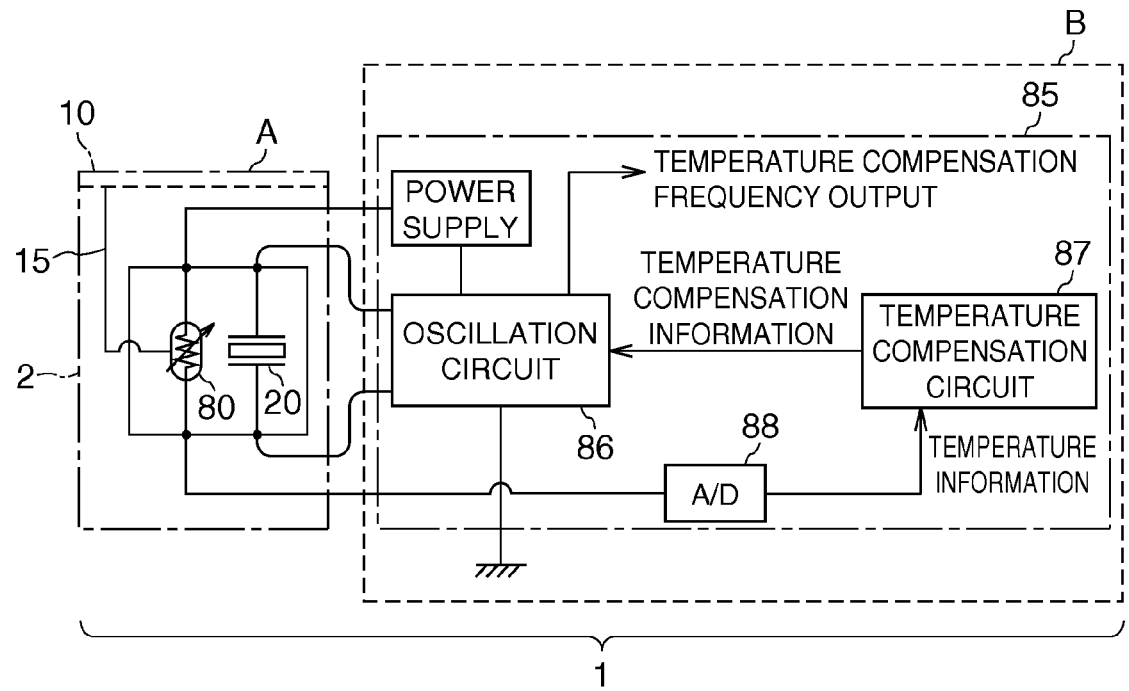
FIG. 8 is the circuit configuration diagram of the crystal oscillator shown in FIG. 7.

FIG. 7 is a longitudinal cross-sectional view showing the configuration of a crystal vibrator (piezoelectric vibrator) according to further another embodiment of the invention. FIG. 8 is the circuit configuration diagram of a crystal oscillator (piezoelectric oscillator) that is configured by the piezoelectric vibrator. The same reference numeral is assigned to the same portion as that of the embodiment shown in FIG. 1 for the description.

The crystal vibrator A is a temperature sensor-attached crystal vibrator (piezoelectric vibrator) that includes: a package 2 having a cross-section shape of "H"; a crystal vibration device (piezoelectric vibration device) 20 that is housed inside an upper concave portion 3 disposed on the upper face of the package 2; a metal lid member 10 that seals the upper concave portion 3 in an airtight manner; and a temperature sensor (temperature-sensitive device) 80 as an electronic component such as a thermistor mounted on the outer bottom face (a lower concave portion 11) of the package 2.

Figure 9:
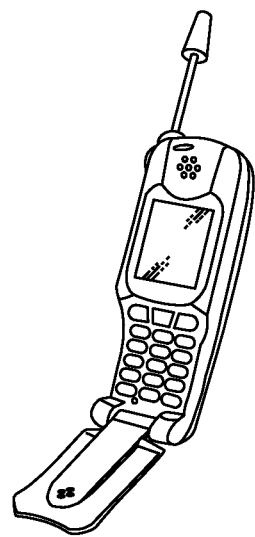
FIG. 9 is a diagram showing a cellular phone.

The crystal oscillator 1 is built in an electronic apparatus by mounting the crystal vibrator A and the IC component (the oscillation circuit and the temperature compensation circuit) on a main board MB located on the side of an external device (for example, an electronic apparatus such as a cellular phone as shown in FIG. 9 or a GPS module) B.

As a user who has purchased the temperature sensor-attached crystal vibrator A mounts it on the main board MB located inside the external device B, a crystal oscillator is formed in accordance with a combination of the temperature sensor-attached crystal vibrator A and the oscillation circuit and the temperature compensation circuit (IC component 85) disposed on the main board MB.

The package 2 includes: an insulating container (insulating substrate) 4 that is formed from a ceramic having the upper concave portion 3 on the upper face; two internal pads (component mounting pads) 5 that are arranged inside the upper concave portion 3 and are electrically connected to excitation electrodes of the crystal vibration device 20; a plurality of mounting terminals 6 that are arranged on the outer bottom face of the insulating container 4; an external pad (temperature sensor mounting pad) 12 arranged inside the outer bottom face (a lower concave portion 11) of the insulating container that is used for mounting the temperature sensor 80; a connection conductor, which is not shown in the figure, allowing each mounting terminal 6, each internal pad 5, and the external pad 12 to be conductive to one another; a lid member 10 made of metal (for example, Kovar) that seals the upper concave portion 3 in an airtight manner in a state in which two internal pads 5 disposed inside the upper concave portion 3 and two excitation electrodes disposed on the crystal vibration device (piezoelectric vibration device) 20 are electrically connected to each other; and a heat transfer member 15 that connects the lid member and the temperature sensor 80 so as to be heat-transferable and has thermal conductivity higher than the material of the insulating substrate that is formed from a ceramic.

The IC component 85 mounted in the external device B includes an oscillation circuit 86, a temperature compensation circuit 87, an A/D converter 88, and the like. The output (temperature information) of the temperature sensor 80 mounted on the crystal vibrator A side is formed as a digital signal by the A/D converter 88, and the digital signal is input to the temperature compensation circuit 87. The temperature compensation circuit 87 outputs frequency control information generated based on the temperature information to the oscillation circuit 86. The oscillation circuit 86 generates temperature compensation frequency information based on the temperature control information and outputs the temperature compensation frequency information.

According to this embodiment, since the temperature sensor 80 mounted on the crystal vibrator A side is thermally connected to the lid member 10 that is disposed at a position proximal to the crystal vibration device 20 through the heat transfer member 15, the sensitivity that is almost the same as that of a case where the temperature of the crystal vibration device is directly detected by the temperature sensor can be acquired.

In addition, a circuit portion that includes the oscillation circuit 86, a power supply, the temperature compensation circuit 87, and the like that have heat generating elements such as amplifier circuits can be arranged so as to be located far from the crystal vibration device. Accordingly, the temperature sensor 80 can detect the temperature of the crystal vibration device more accurately.

Although the configuration has been described in which the neutral terminal is not conductive to the mounting terminal, for example, even when a wiring is connected between the neutral terminal and the mounting terminal, in a case where the heat transfer characteristics are superior owing to a structure in which there are more short paths on the side of the wiring that is a heat transfer member connecting the neutral terminal and the lid member, the advantages according to the embodiment of the invention can be expected. However, in order to acquire sufficient advantages, as in the above-described embodiments, it is more preferable to employ a configuration in which the neutral terminal is not allowed to be conductive to the mounting terminal.

Each embodiment of the invention that includes the above-described configuration has the following advantages.

In a crystal oscillator provided with a temperature compensation function, when the frequency is corrected based on an incorrect temperature data signal (voltage value) for the crystal vibration device that is detected by the temperature sensor, there is a problem in that the frequency drift characteristics, which represent a frequency variation difference between an oscillation frequency at a time point when a voltage is applied to the crystal oscillator and an oscillation frequency at a time point when a predetermined time elapses after the application of the voltage, deteriorate.

According to the embodiment of the invention, the lid member that is located at a position closest to the crystal vibration device housed in an airtight space of the package and the temperature sensor (the IC component in which the temperature sensor is mounted) are thermally connected to each other through the heat transfer member having high thermal conductivity. Accordingly, incorrect temperature data is not output from the temperature sensor, whereby the frequency drift characteristics can be improved.

In addition, in the above-described embodiments, the insulating container including the upper concave portion 3 on the upper face side has been illustrated as the insulating substrate 4 as an example. However, it may be configured such that the crystal vibration device 20 is mounted on the insulating substrate 4 having a flat upper face by using a conductive adhesive, and a space on the insulating substrate including the crystal vibration device is sealed by a reverse bowl-shaped metal lid (lid member) in an airtight manner.

In the above-described embodiments, as a representative example of the piezoelectric oscillator, the crystal oscillator has been illustrated. However, the embodiment of the invention can be also applied to a general oscillator using a piezoelectric vibration device that is formed from a piezoelectric material or a piezoelectric device such as an angular-velocity sensor that uses a piezoelectric vibration device as a physical amount sensor.

What is claimed is:

1. A piezoelectric device comprising:
    an insulating substrate including:
        a first concavity bordered by a first wall; and
        a second concavity bordered by a second wall, the second concavity opening in an opposite direction as the first concavity;
    an element mounting pad mounted to the insulating substrate in the first concavity;
    a piezoelectric vibration element mounted to the element mounting pad;
    a temperature sensor mounting pad mounted to the insulating substrate in the second concavity;
    a temperature sensor mounted to the temperature sensor mounting pad;
    a metal sealing body secured to the first wall;
    a metal lid secured to the metal sealing body, the metal lid enclosing the first concavity;
    a metal heat transfer member reaching to the metal sealing body from the temperature sensor mounting pad by way of the first wall so as to thermally connect the temperature sensor and the metal lid.

2. The piezoelectric device according to claim 1, wherein the temperature sensor is a thermistor.

3. The piezoelectric device according to claim 1, wherein the first wall has a through hole, and
    the metal heat transfer member extends through the through hole.

4. The piezoelectric device according to claim 2, wherein the first wall has a through hole, and
    the metal heat transfer member extends through the through hole.

5. The piezoelectric device according to claim 1, wherein the first wall has an inner surface adjacent the first concavity, and
    the metal heat transfer member extends along the inner surface.

6. The piezoelectric device according to claim 2, wherein the first wall has an inner surface adjacent the first concavity, and the metal heat transfer member extends along the inner surface.

7. The piezoelectric device according to claim 1, wherein the metal heat transfer member further comprises a plurality of wirings.

8. The piezoelectric device according to claim 5, wherein the metal heat transfer member further comprises a plurality of wirings.

9. The piezoelectric device according to claim 6, further comprising:
the metal heat transfer member further comprises a plurality of wirings.

10. The piezoelectric device according to claim 1, further comprising:
a mounting terminal mounted to the second wall; and
a connection conductor having a first end electrically connected to the mounting terminal and a second end electrically connected to the temperature sensor mounting pad so as to electrically connect the mounting terminal and the temperature sensor.

11. The piezoelectric device according to claim 5, further comprising:
a mounting terminal mounted to the second wall; and
a connection conductor having a first end electrically connected to the mounting terminal and a second end electrically connected to the temperature sensor mounting pad so as to electrically connect the mounting terminal and the temperature sensor.

12. The piezoelectric device according to claim 6, further comprising:
a mounting terminal mounted to the second wall; and
a connection conductor having a first end electrically connected to the mounting terminal and a second end electrically connected to the temperature sensor mounting pad so as to electrically connect the mounting terminal and the temperature sensor.

13. The piezoelectric device according to claim 10, further comprising:
a second mounting terminal mounted to the second wall, the second mounting terminal being electrically connected to the element mounting pad.

14. The piezoelectric device according to claim 11, further comprising:
a second mounting terminal mounted to the second wall, the second mounting terminal being electrically connected to the element mounting pad.

15. An electronic apparatus comprising:
the electric device according to claim 1.

16. An electronic apparatus comprising:
the electric device according to claim 2.

17. An electronic apparatus comprising:
the electric device according to claim 3.

18. An electronic apparatus comprising:
the electric device according to claim 4.

19. An electronic apparatus comprising:
the electric device according to claim 5.

20. An electronic apparatus comprising:
the electric device according to claim 6.

* * * * *